United States Patent [19]

Ono et al.

[11] Patent Number: 4,607,147

[45] Date of Patent: Aug. 19, 1986

[54] MEMBRANE SWITCH

[75] Inventors: Yasuichi Ono; Yoshitada Amagishi; Moritoshi Nakamura, all of Miyagi, Japan

[73] Assignee: Alps Electric Co., Ltd., Japan

[21] Appl. No.: 678,985

[22] Filed: Dec. 6, 1984

[30] Foreign Application Priority Data

Dec. 10, 1983 [JP] Japan .................. 58-189859[U]

[51] Int. Cl.4 ............................................. H01H 13/70
[52] U.S. Cl. ................................. 200/159 B; 200/292; 200/5 A; 339/17 F
[58] Field of Search ............ 200/159 B, 306, 267-269, 200/5 A, 5 R, 292, 304, 305; 339/17 F, 176 MF; 174/86.5

[56] References Cited

U.S. PATENT DOCUMENTS

| 3,982,081 | 9/1976 | Demler, Jr. | 200/5 R |
|---|---|---|---|
| 4,045,636 | 8/1977 | Yoder et al. | 200/292 |
| 4,046,975 | 9/1977 | Seeger, Jr. | 200/5 A |
| 4,066,851 | 1/1978 | White et al. | 200/5 A |
| 4,081,892 | 4/1978 | Taylor, Jr. et al. | 200/159 B X |
| 4,113,981 | 9/1978 | Fujita et al. | 339/17 F X |
| 4,249,044 | 2/1981 | Larson | 200/5 A |
| 4,365,130 | 12/1982 | Christensen | 200/306 |
| 4,365,408 | 12/1982 | Ditzig | 200/159 B |
| 4,382,165 | 5/1983 | Batash et al. | 200/5 A |
| 4,385,215 | 5/1983 | Lemberg | 200/5 A |
| 4,425,484 | 1/1984 | Fukukura | 200/5 A |
| 4,433,223 | 2/1984 | Larson et al. | 200/159 B |
| 4,450,324 | 5/1984 | Fukukura et al. | 200/5 A |
| 4,458,969 | 7/1984 | Demeo | 339/17 F |
| 4,461,934 | 7/1984 | Jabben | 200/159 B X |
| 4,484,039 | 11/1984 | Salie | 200/5 A |
| 4,493,952 | 1/1985 | Kaleida | 200/5 A |

Primary Examiner—Stephen Marcus
Assistant Examiner—Ernest G. Cusick
Attorney, Agent, or Firm—Guy W. Shoup

[57] ABSTRACT

A membrane switch comprises an insulating substrate on the surface of which thin-film-like electrodes are formed with a connecting lug section provided integrally at one end of the substrate. Thin-film-like conductive layers continuing from the electrodes are extending up to the connecting lug section and the extended end portions of the conductive layers compose a connecting terminal section.

5 Claims, 31 Drawing Figures 4,607,147

MEMBRANE SWITCH

FIELD OF THE INVENTION

The present invention relates to a membrane switch.

SUMMARY OF THE INVENTION

It is an object of the present invention to provide a membrane switch of a high productivity.

The membrane switch according to the present invention is characterized in that a connecting lug section is provided integrally at one end of an insulating substrate on the surface of which thin-film-like electrodes are formed, thin-film-like conductive layers continuing from the electrodes are extending up to the connecting lug section with their extended end portions composing a connecting terminal section so that this connecting terminal section will be connected to a terminal section of another circuit board.

BRIEF DESCRIPTION OF THE DRAWINGS

All the drawings are for explanation of the embodiments of the present invention in which.

DETAILED DESCRIPTION OF THE INVENTION

Figure 1:
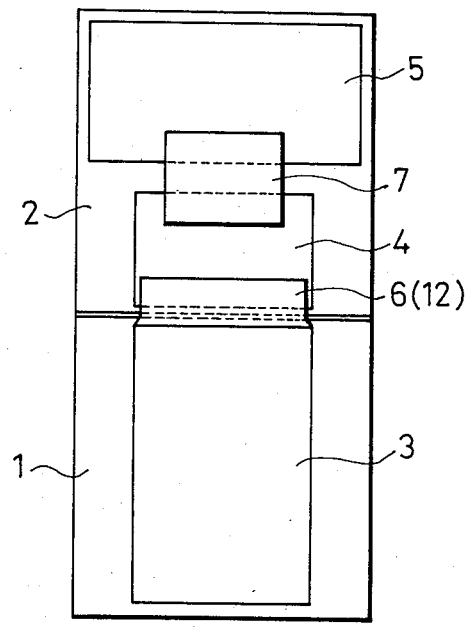
FIG. 1 is a schematic diagram illustrating one example of the portable electronic devices.

The embodiments of the present invention will be described with reference to the drawings. FIG. 1 is the schematic diagram which illustrates one example of the portable electronic devices such as electronic game sets or electronic table-top calculators. This illustrated portable electronic device comprises a lower case 1 and an upper case 2 of the collapsible type, in which the lower case 1 is equipped with a membrane switch 3 serving as the input device and the upper case 2 is equipped with a print-circuit board 4 with electronic parts and the like mounted thereon and a liquid-crystal display 5. The membrane switch 3 and the print-circuit board 4 are connected through a heat-seal connector 6, and the print-circuit board 4 and the liquid-crystal display 5 are connected through a heat-seal connector 7.

The heat-seal connector 6 is integral with the membrane switch 3. The construction and manufacturing processes of this one-unit assembly will be described with reference to FIGS. 2 through 10.

Figure 2:
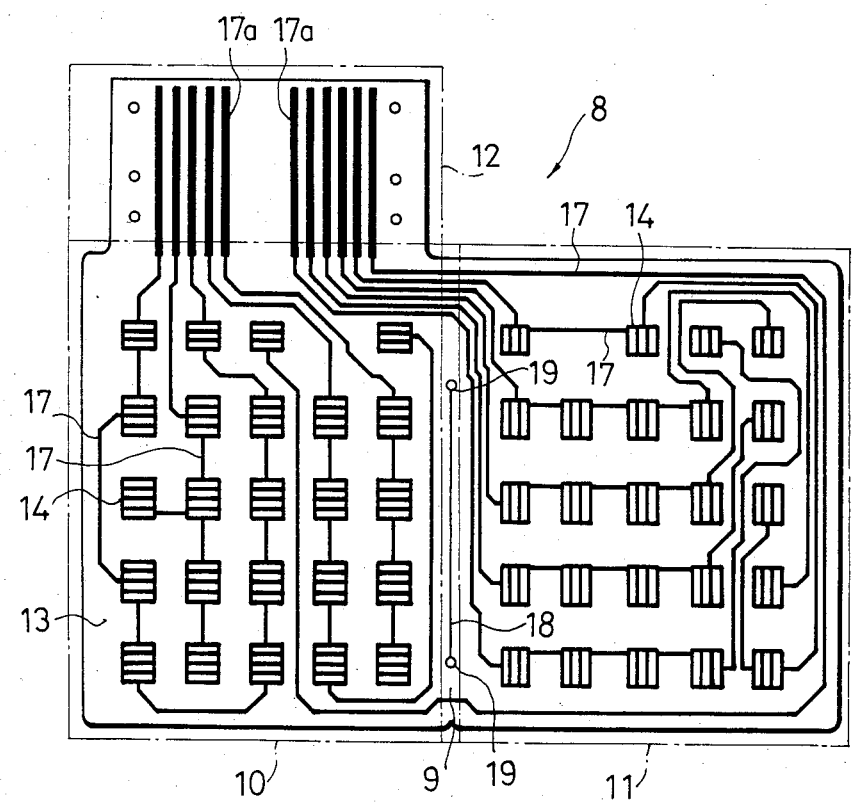
FIG. 2 is a plan of an electrode assembly.

FIG. 2 is the plan of an electrode assembly 8 for the membrane switch which is formed integrally together with the heat-seal connector 6. This electrode assembly 8 comprises a fold-up section 9 occupying vertically or lengthwisely about the center position thereof, a lower electrode section 10 provided on the left side of the fold-up section 9 in facing the drawing, an upper electrode section 11 provided on the right side of the fold-up section 9 in facing the drawing, and a connecting lug section 12 extending from one end of the lower electrode section 10. These fold-up section 9, lower electrode section 10, upper electrode section 11 and connecting lug section 12 lie as one unit on a base film 13. This base film 13 is made of electrically insulating flexible synthetic resins such as polyester, polyimide or polyamide.

Figure 10:
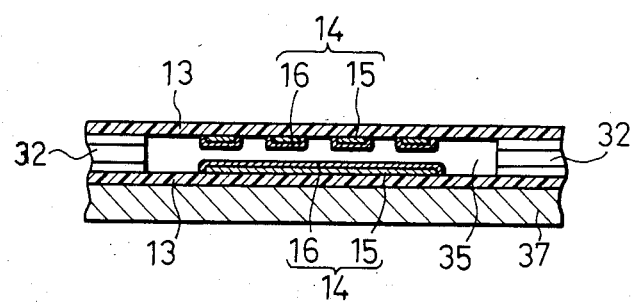
FIG. 10 is an enlarged sectional view showing the opposing state of upper and lower electrodes.

On the lower electrode section 10 and the upper electrode section 11 a number of thin-film-like electrodes 14 are formed in regular order at right-left symmetrical positions through the printing technique. The electrode 14 has, as shown in FIG. 10, a two-layer structure consisting of a thin silver layer 15 printed first on the base film 13 and a thin carbon layer 16 formed as to cover the silver layer 15. Also, as shown in FIG. 2, the plane shape of the electrode 14 is substantially quadrangular, the electrode 14 of the lower electrode section 10 has a horizontal stripe-pattern, and the electrode 14 of the upper electrode section 11 has a vertical stripe-pattern, so that when the corresponding upper and lower electrodes 14 come into contact together, the stripes of the patterns cross one another. As a result of such an arrangement as above, the contact between the upper and lower electrodes 14 is maintained reliably and, moreover, the amounts of silver and carbon to be used can be reduced remarkably.

Respective electrodes 14 of the lower electrode section 10 and upper electrode section 11 are connected by plural thin-film-like stripe-shaped conductive layers 17, and the end portion 17a each of respective conductive layers 17 is extending up to the connecting lug section 12 and composes a terminal section of the electrode. But, the end portion 17a does not reach the margin of the connecting lug section 12 (the base film 13), and terminates before the edge of the film 13 on the lug section 12. Similarly to the electrode 14, the conductive layer 17 has a two-layer structure consisting of a thin silver layer 15 printed on the base film 13 and a thin carbon layer 16 formed as to cover the silver layer 15. Accordingly, the electrode 14 and the conductive layer 17 are formed simultaneously on the same plane of the base film 13.

At substantially the center position of the fold-up section 9 a cut 18 is formed along an imaginary fold-up line, the ends of which do not reach the margins of the base film 13 and the conductive layer 17 traversing the foregoing turn-up line, and at either end of the cut 18 there is formed a thru-hole 19 of any shape such as circular, elliptical, triangular, or quadrangular, to prevent generation of cracks.

Accordingly, there remain narrow coupling sections 20 between both ends of the cut 18 and the margins of the base film 13 (see FIG. 3), and by these coupling sections 20 and the cut 18, folding of the electrode assembly 8 can easily be achieved. Incidentally, it would be feared that an internal stress appears in the coupling section 20 as a result of folding, cracks generate from the cut 18 toward the margins of the base film 13, and portions of the conductive layers 17 are cut off. With respect to the foregoing problem, as the thru-hole 19 is formed at either end of the cut 18 as described above, generation of cracks is prevented and the conductive layer 17 can not be cut off. In case the shape of the thru-hole 19 is selected specifically to be circular, inclusive of elliptical, the effect of preventing generation of cracks is improved remarkably.

Figure 4A:
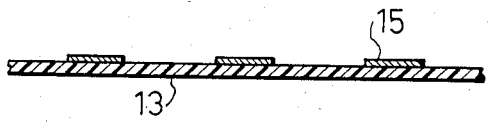
FIGS. 4a, 4b, 4c and 4d are sectional views showing the steps of forming a connecting lug section of the electrode assembly.
Figure 4B:
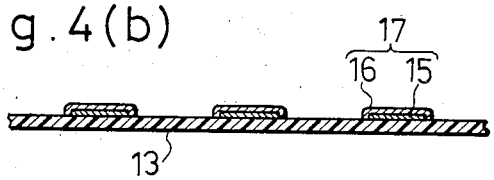
Figure 4C:
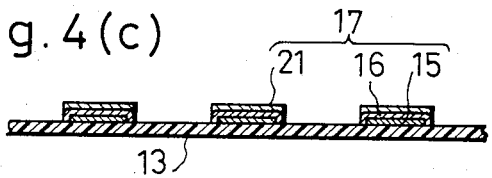
Figure 4D:
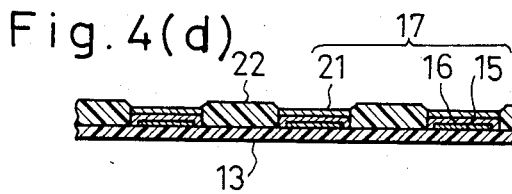
Figure 5:
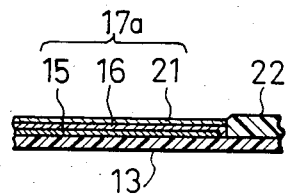
FIG. 5 is an enlarged sectional view taken along line (A)—(A) in FIG. 3.

Now, the construction of the connecting lug section 12 will be described. FIGS. 4a through 4d are the sectional views showing the steps of forming the connecting lug section 12. As described hereinabove, the silver layer 15 and the carbon layer 16 are formed successively on the base film 13 through the printing technique (see FIGS. 4a and 4b), and thereafter, a conductive hot-melt type bonding agent layer 21 is formed by the printing technique on the carbon layer 16, which composes a part of the conductive layer 17 (see FIG. 4c). Then, on the remaining surface portions of the base film 13, not formed with the conductive layer 17 (the silver layer 15, the carbon layer 16, and the conductive hot-melt type bonding agent layer 21), i.e., on either side of the conductive layer 17 and on the surface portions between the end portion 17a of the conductive layer 17 and the margin of the base film 13 (see FIG. 5), an electrically insulating hot-melt type bonding agent layer 22 is formed. As shown in FIGS. 4d and 5, this bonding agent layer 22 is formed into a thick film by the printing technique as to project a little beyond the surface of the foregoing bonding agent layer 21.

Figure 3:
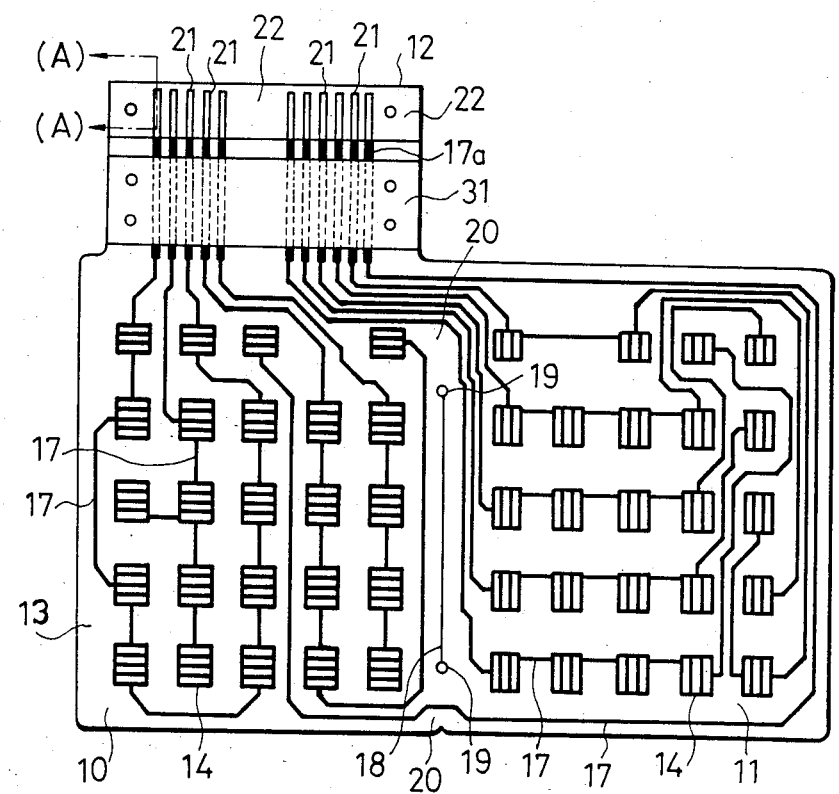
FIG. 3 is a plan of the electrode assembly formed at predetermined positions with a bonding agent layer of the hot-melt type and a protective film.

However, the bonding agent layers 21, 22 are not formed on the whole surface of the connecting lug section 12, but, as shown in FIG. 3, are formed as much as certain width on the tip side of the connecting lug section 12. By means of these bonding agent layers 21, 22 the connecting lug section 12 (the electrode assembly 8) is bonded and secured to the print-circuit board 4 which will be described hereinafter.

The conductive hot-melt type bonding agent layer 21 is formed by applying, through the printing technique and the like, a paint containing thermoplastic high-molecular binding material, organic solvent, conductive fine powder, and, as occasion demands, viscosity-giving material, filler and the like. The electrically insulating hot-melt type bonding agent layer 22 is similarly formed by applying a paint containing thermoplastic high-molecular binding material, organic solvent, hydrophobe-giving compound, and, as occasion demands, viscosity-giving material, filler and the like.

As the thermoplastic high-molecular binding material, one or some combinations of ethylene-acetic vinyl copolymer, polyester resin, polyamide resin, polymethylmethacrylate resin, chloroprene-series synthetic rubber, and the like, of high moisture-resistance, is employed, whose content percentage is preferably about 5 to 65 wt%.

As the organic solvent, low boiling point organic liquid is employed such as toluene, isophorone, benzylalcohol, Carbitol, Carbitolacetate, decalin, acetophenone, and the like, evaporatable substantially wholly at heating temperatures of the order of 120° to 200° C., whose content percentage is preferably about 25 to 65 wt%.

As the conductive fine powder, fine powder of carbon such as black lead or carbon black, or of metal such as silver, is employed, whose content percentage is preferably about 30 to 60 wt%.

As the viscosity-giving material, plasticizer of DOP, ester-series resin, terpene-series resin, fatty-series resin, phenole resin and the like is employed, whose content percentage is preferably about 20 wt% or less.

As the filler, titanium oxide, silicon oxide and the like is employed, whose content percentage is preferably about 25 wt% or less.

As the insulating substrate 23 composing the print-circuit board 4, glass, ceramic, glass-epoxy resin composite and the like is employed. But, because these materials include silicon dioxide, no sufficient strength of adhesion would normally be obtained in relation to the hot-melt type bonding agent and, especially, the strength of adhesion lowers extremely at high humidity and the bonding agent comes off from the surface of the insulating substrate 23.

The reason for the foregoing defect seems to be that the silanol radical (Si-OH) existing on the surface of the insulating substrate 23 including silicon dioxide, such as glass, ceramic, or glass-epoxy resin composite, has the hydrophilic property, this silanol radical adsorbs water molecules ($H_2O$) at high humidity, these water molecules meet other water molecules, and as a result, a layer 24 of water is generated on the surface of the insulating substrate 23. That is, if the layer 24 of water is formed in the interface between the insulating substrate 23 and the hot-melt type bonding agent 25, the bonding agent 25 comes off readily from the spot where the layer of water, 24 appears.

In order to overcome these troubles, the hydrophobe-giving compound is added to and mixed with the hot-melt type bonding agent layer 22 which unites chemically with oxygen of the silanol radical (Si-OH) existing on the surface of the insulating substrate 23 to be bonded to give the hydrophobe property to the bonding surface.

As the hydrophobe-giving compound, there are metallic salt, metallic oxide, coupling material, isocyanate compound, lewis base, etc. More definitely, such as nickel chloride, or molybdenum acid ammonium is employed as metallic salt, and such as chromic oxide is employed as metallic oxide. As the coupling material, titanium coupling material, or silane coupling material such as methylchlorosilane, phenyletrichlorosilane, $\gamma$-aminopropyltriethoxysilane, or trichlorsilane, is employed. The content percentage of the hydrophobe-giving compound is preferably about 0.1 to 25 wt%.

Figure 14A:
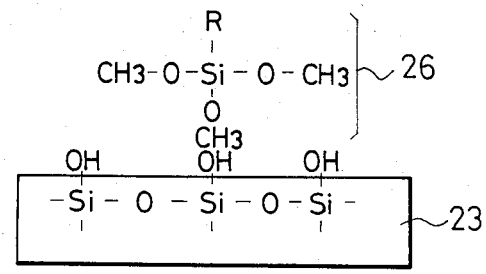
FIGS. 14a and 14b are explanatory diagrams illustrating the states, respectively, before and after the reaction takes place between silanol radical on the surface of the insulating substrate and silane coupling material in the bonding agent.
Figure 14B:
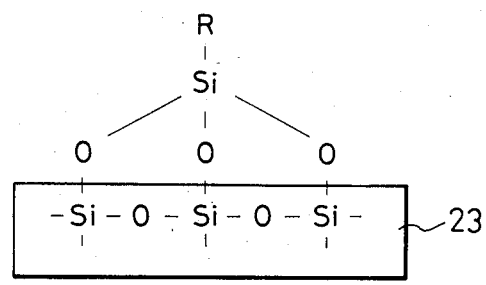
Figure 15A:
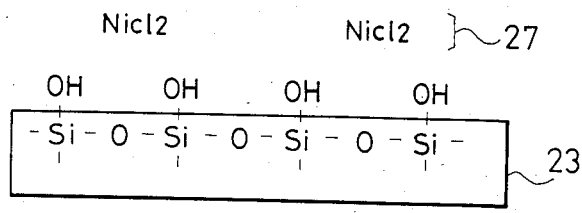
FIGS. 15a and 15b are explanatory diagrams illustrating the states, respectively, before and after the reaction takes place between silanol radical on the surface of the insulating substrate and nickel chloride in the bonding agent.
Figure 15B:
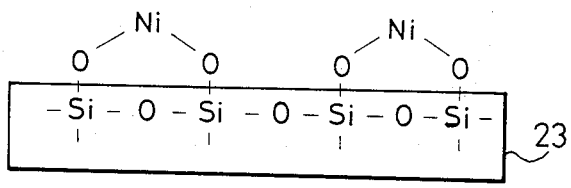
Figure 16:
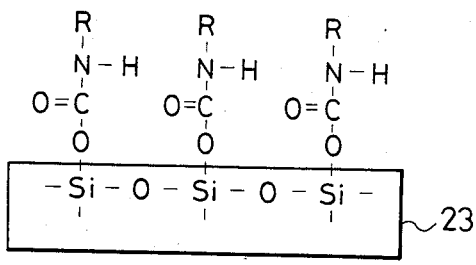
FIG. 16 is an explanatory diagram illustrating the state where the reaction took place between silanol radical on the surface of the insulating substrate and isocyanate compound in the bonding agent.
Figure 17:
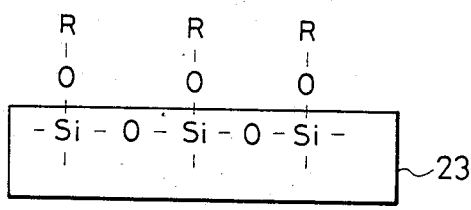
FIG. 17 is an explanatory diagram illustrating the state where the reaction took place between OH radical at the polyester terminal and silanol radical by addition of lewis base.

FIGS. 14a and 14b illustrate the state, respectively, before and after the reaction takes place between silanol radical (Si-OH) existing on the surface of the glass-made insulating substrate 23 and silane coupling material in the bonding agent. FIGS. 15a and 15b illustrate the states, respectively, before and after the reaction takes place between silanol radical (Si-OH) existing on the surface of the insulating substrate 23 and nickel chloride (metallic salt) 27 in the bonding agent. FIG. 16 illustrates the state where the reaction took place between silanol radical (Si-OH) existing on the surface of the insulating substrate 23 and isocyanate compound in the bonding agent. FIG. 17 illustrates the state where the reaction took place between OH radical at the polyester terminal and silanol radical (Si-OH) by addition of lewis base.

Figure 13:
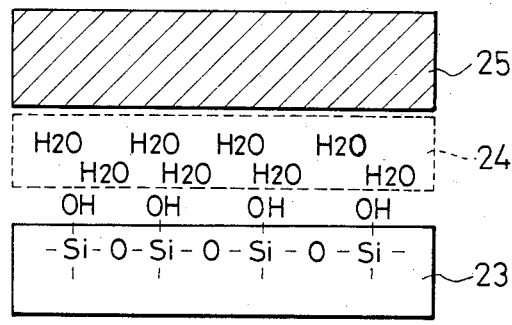
FIG. 13 is an explanatory diagram illustrating the state where a layer of water is generated between an insulating substrate and an ordinary bonding agent.

As will be clear from these drawings, by heating and pressing the hot-melt type bonding agent onto the surface of the insulating substrate 23, the hydrophobe-giving compound included therein is chemically united strongly with oxygen of the silanol radical existing on the substrate surface and as a result, the surface of the insulating substrate 23 assumes the hydrophobe property. Accordingly, as shown in FIG. 13, even under the circumstances of high humidity the layer of water, 24 can not be built up between the insulating substrate 23 and the bonding agent 25 and a large adhesive force is obtained.

Examples of compounding of the hot-melt type bonding agent are as follows:

COMPOUNDING EXAMPLE 1

Weighing is effected with respect to chloroprene-series synthetic rubber (trade name: VINYLOL 2200, made by Showa Kohbunshi Co.) as the high-molecular binding material, of 200 part by weight, polyester resin (trade name: 7662, made by Bostic Japan Co.) of 100 part by weight, isophorone as organic solvent, of 300 part by weight, and silane coupling material (trade name: X-12-413, made by Shinetsu Kagaku Co.) as hydrophobe-giving compound, of 4 part by weight, and these components are mixed by a powdering machine for four hours.

The thus prepared paint is used to screen-print a pattern of 40×10 mm size by the use of a stainless steel-made mask of 200 mesh on a polyester film of 50×50 mm. Then, it is dried at 120° C. for five minutes, resulting in a hot-melt type bonding agent layer of about 20 $\mu$m in film thickness. The foregoing polyester film is piled on a slide glass of 25×76 mm with 1.2 mm thick so as to sandwitch the bonding agent layer therebetween, and heated and pressed under a pressure of 15 kg/cm$^2$ at a heating temperature of 180° C. for eight seconds, resulting in the polyester film bonded to the glass board.

Figure 18:
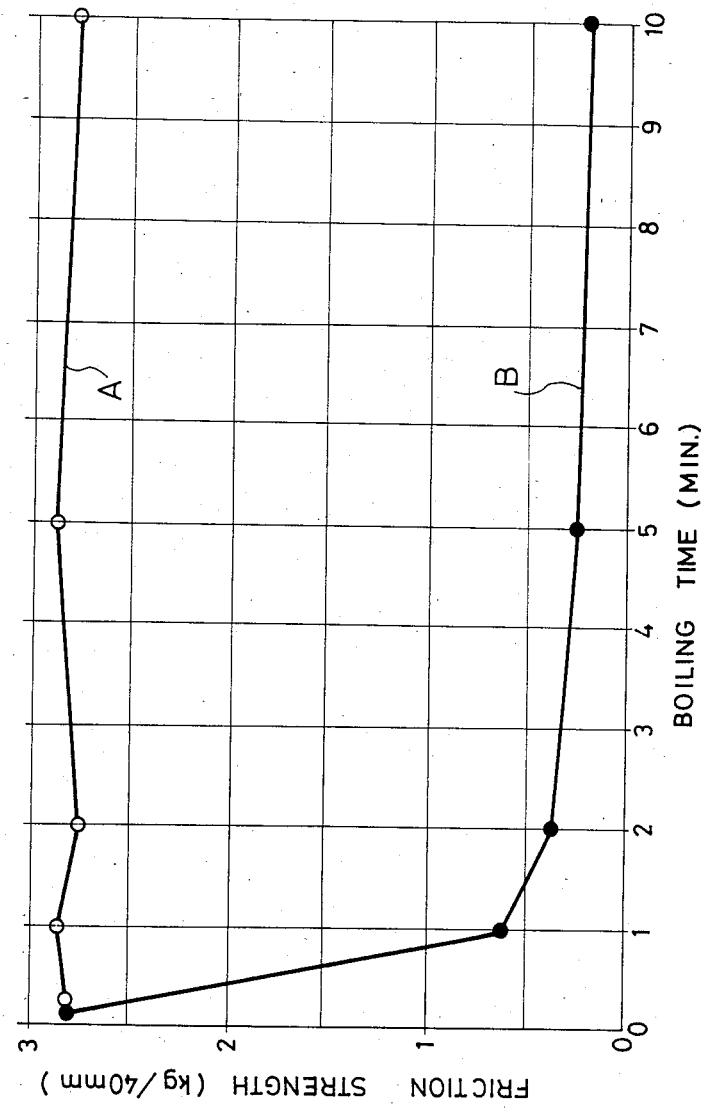
FIG. 18 is a characteristic graph showing the friction strength.

FIG. 18 is the characteristic graph showing the friction strength curves with one for the hot-melt type bonding agent obtained in accordance with compounding example 1 and the other for the bonding agent of the same components except for the silane coupling material not added. That is, the curve A is the characteristic curve of the bonding agent obtained from compounding example 1 and the curve B is the characteristic curve of the sample agent not added with the foregoing silane coupling material.

Figure 19:
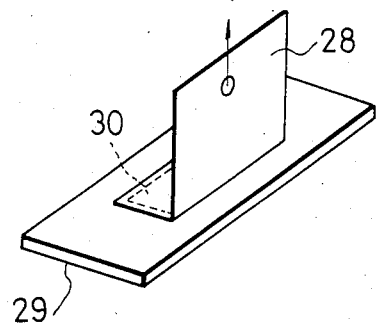
FIG. 19 is a perspective view for explanation of the test of friction strength.

In testing the friction strength, the samples are allowed to stand for fifteen minutes under the circumstances of ordinary temperature and ordinary humidity after completion of bonding or after enough wiping off of water following one-, two-, five-, or ten-minutes boiling after the bonding completion. Thereafter, as shown in FIG. 19, a portion not bonded of the polyester film 28 is erected perpendicularly to the slide glass 29 and drawn by a spring balance in the arrow direction to measure the friction strength. In this drawing, 30 indicates the bonding agent layer.

As apparent from FIG. 18, in the case of the hot-melt type bonding agent of the curve B, the friction strength lowers to about 1/6 for one-minute boiling and further decreases as the time elapses. On the contrary, the hot-melt type bonding agent according to the present compounding example changes very little its friction strength even in the test thereof on boiling and bears always a high friction strength.

COMPOUNDING EXAMPLE 2

Weighing is effected with respect to chloroprene-series synthetic rubber (trade name: VINYLOL 2202, made by Showa Kohbunshi Co.) as the thermoplastic high-molecular binding material, of 500 part by weight, polyester resin (trade name: 7662, made by Bostic Japan Co.) of 250 part by weight, isophorone as organic solvent, of 400 part by weight, nickel chloride as hydrophobe-giving compound, of 12 part by weight, DOP as plasticizer of 15 part by weight, and titanium oxide as filler, of 12 part by weight, and these components are mixed to produce a paint.

Similarly to compounding example 1, this paint is used to screen-print a pattern of 40×10 mm size by the use of a stainless steel-made mask of 200 mesh on a polyester film of 50×50 mm. Then, it is dried at 120° C. for five minutes, resulting in a hot-melt type bonding agent layer of about 2 $\mu$m in film thickness. The foregoing polyester film is piled on a slide glass of 25×76 mm with 1.2 mm thick so as to sandwitch the bonding agent layer therebetween, and heated and pressed under a pressure of 15 kg/cm$^2$ at a heating temperature of 170° C. for six seconds, resulting in the polyester film bonded to the glass board.

Figure 20:
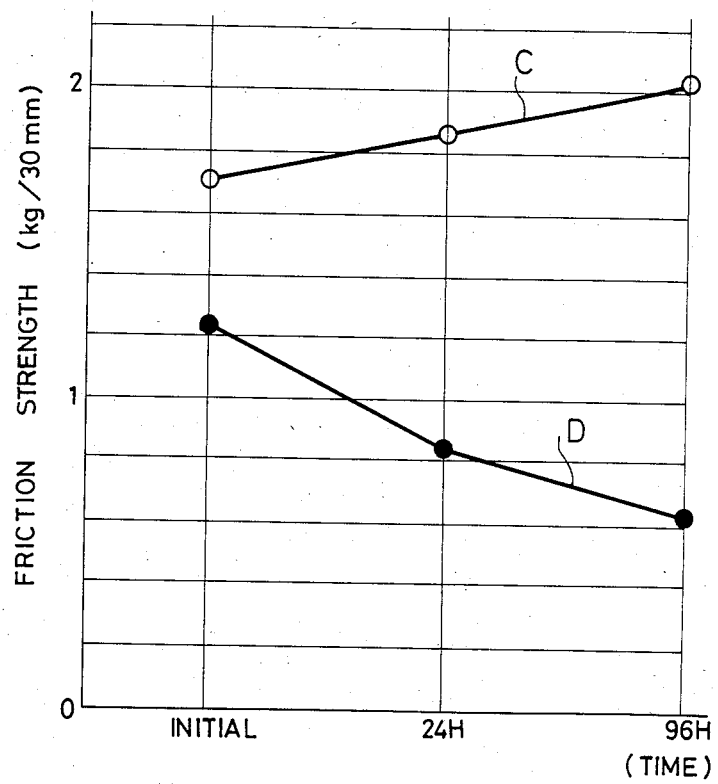
FIGS. 20 and 21 are characteristic graphs showing the friction strength.

FIG. 20 is the characteristic graph showing the friction strength curves with one for the hot-melt type bonding agent obtained in accordance with compounding example 2 and the other for the bonding agent of the same components except for nickel chloride being not added. That is, the curve C is the characteristic curve of the bonding agent obtained from compounding example 2 and the curve D is the characteristic curve of the sample agent not added with the foregoing nickel chloride. Provided that the friction strength was tested under the conditions of a temperature of 65° C. and a humidity of 95%.

As apparent from this drawing, the bonding agent of the curve D has the friction strength which lowers gradually as the time elapses under the conditions of high temperature and high humidity, whereas the agent of the present compounding example has always a high friction strength even under high temperature and high humidity conditions.

As described hereinabove, in case the base film 13 of the electrode assembly 8 (the connecting lug section 12) is made of a polyester film and the insulating substrate used as the print-circuit board 4 is constructed by glass, ceramic, glass-epoxy resin composite and the like, and if chloroprene-series synthetic rubber and polyester resin are used in combination as the thermoplastic high-molecular binding material of the hot-melt type bonding agent layer 22 for bonding the former two together, as noted in compounding examples 1 and 2, excellent bonding is obtained.

Further, with taking into account the bonding property of the conductive hot-melt type bonding agent layer 21 with the insulative hot-melt type bonding agent layer 22 as described above or with the polyester-made base film 13 in some cases, it is desirable to employ polyester resin as the thermoplastic high-molecular binding material.

Figure 6:
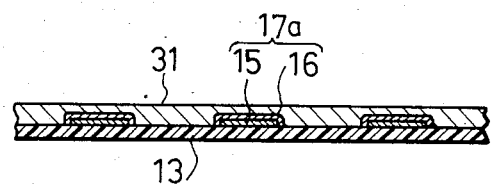
FIG. 6 is an enlarged sectional view of the connecting lug section formed with the protective film.

As apparent from FIG. 1, at the time of opening and closing the upper case 2 relative to the lower case 1, a bending action is applied repeatedly to the heat-seal connector 6, i.e., a portion of the connecting lug section 12. Therefor, as shown in FIG. 3, a protective film 31 bearing electrical insulation and elasticity is formed at portions of the connecting lug section 12 to which a bending action is applied. As shown in FIG. 6, this protective film 31 is formed over the surface of each conductive layer 17 and the surface portions of the base film 13 where any conductive layer 17 is not formed.

This protective layer 31 is provided to prevent generation of cracks in the thin-film-like conductive layer 17 that would be caused by repetition of the bending action and/or falling off of the conductive layer 17 from the base film 13.

As the constituent material of the protective film 31, rubber-like material such as silicon-elastomer is preferable. If epoxy resin, for example, is employed as the protective film 31, it becomes hard through a drying process after application and produces the protective film 31 of no elasticity. As a result, the bending property of the connecting lug section 12 is hindered, cracks appear in the protective film 31 in response to repetition of the bending action, and the film falls off together with the conductive layer 17; thus, the protective film 31 can not exert its function. In this connection, in case the protective film 31 possesses elasticity and flexibility, the bending property of the connecting lug section 12 is not hindered, the protective film 31 responds well to the bending action, thus, cracks do not appear in the protective film 31 and the conductive layer 17 is protected satisfactorily.

The so-called RTV (Room Temperature Vulcanization) type silicon-elastomer, produced by allowing polysiloxane prepolymer having at its terminal reaction radicals such as Si-OH, Si-OR, Si-H, Si-CH=CH$_2$ to react at room temperature in the presense of a catalyst, has a three-dimentional structure wherein molecular chain's extension and bridge have taken place and is preferable as the protective film 31.

One preferred example of the silicon paint used to form the protective film 31 is as follows:

COMPOUNDING EXAMPLE

○ High viscosity silicon-elastomer mixed with catalyst (trade name: SE 1700, made by Tohre Silicon Co.)—80 part by weight, ○ Low viscosity silicon-elastomer (trade name: CY 52-005, made by Tohre Silicon Co.)—20 part by weight, and ○ Hardener for SE 1700—10 part by weight.

This paint is a solventless paste and gives a preferred printability (on screen-printing) because a high viscosity silicon-elastomer is blended with a low viscosity silicon-elastomer. This paint is able to form a thick film, so that by doing printing at a predetermined position of the connecting lug section 12 and heating at 150° C. for ten to fifteen minutes, the flexible and elastic protective film 31 is formed.

Figure 21:
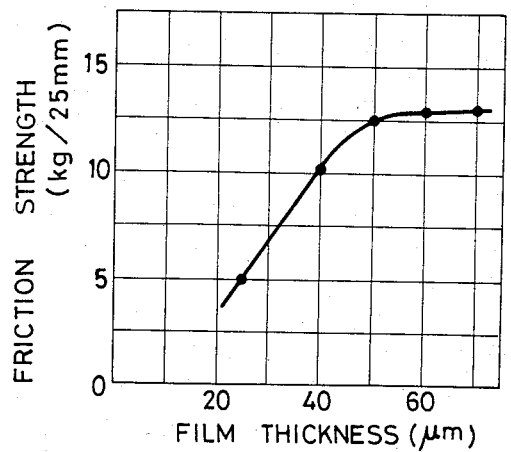

The thus formed protective film 31 has a high adhesion strength in that the tensile adhesion strength (JIS A5755) relative to the base film 13 (the polyester film) is 16 kg/cm$^2$ and the tensile shearing adhesion strength (JIS K6801) is 30 kg/cm$^2$. FIG. 21 is the characteristic graph showing the relationship between the film thickness of the protective film 31 formed on the base film 13 and the friction strength (JIS S6040: STRENGTH kg/25 mm). As apparent from this drawing, the film thickness of the protective film 31 is made more than 40 $\mu$m, preferably in the order of 50 to 70 $\mu$m.

Again, the membrane switch 3 will be described. As shown in FIG. 3, after formation of the hot-melt type bonding agent layers 21, 22 and the protective film 31 at the connecting lug section 12, a spacer 32 is first adhered to the surface of either the lower electrode section 10 or the upper electrode section 11 (to the surface of the lower electrode section 10 in the illustrated embodiment).

Figure 7:
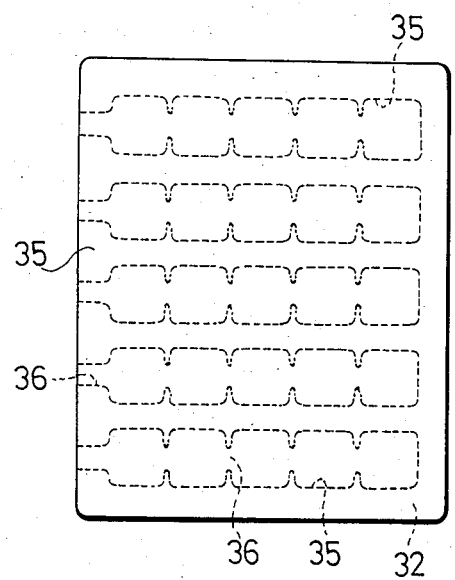
FIGS. 7 and 8 are a plan and an enlarged sectional view, respectively, of a composite consisting of a spacer and a peel-off paper.
Figure 8:
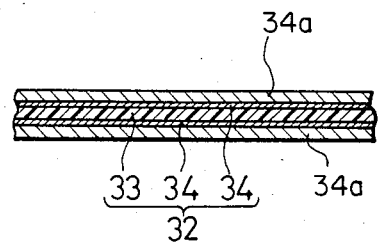

FIGS. 7 and 8 are the plan and the enlarged sectional view, respectively, of the composite consisting of the spacer 32 and a peel-off paper 34a. As shown in FIG. 8, the spacer 32 comprises a sheet-like base 33 and adhesive layers 34 provided on both surfaces of the former, with peel-off papers 34a applied on the surfaces of the adhesive layers 34.

Figure 9:
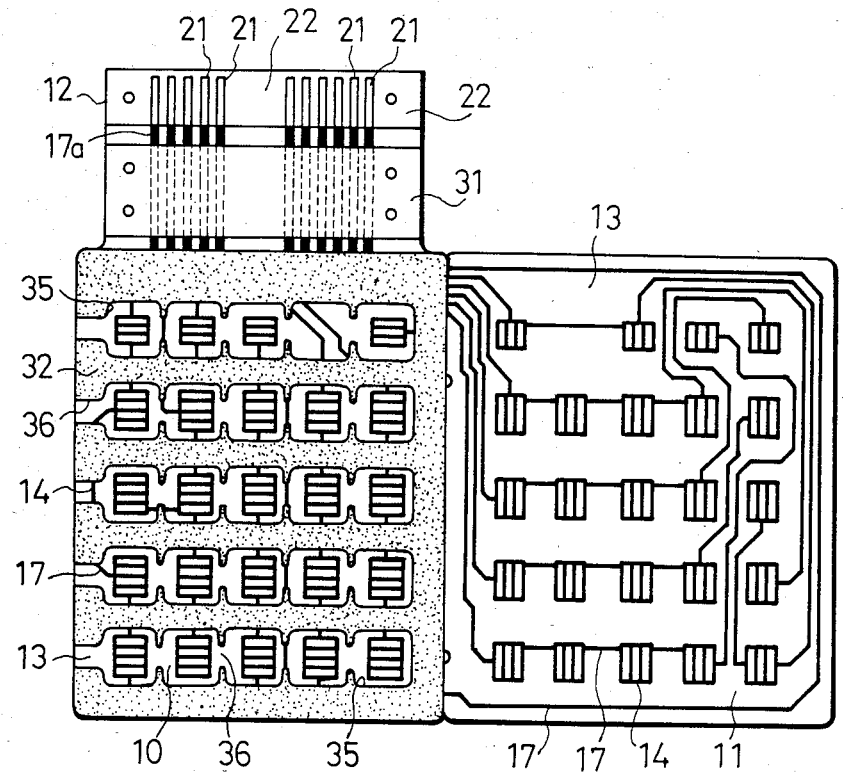
FIG. 9 is a plan of the electrode assembly pasted with the spacer.

As shown in FIGS. 7 and 9, at portions of the spacer 32 corresponding to respective electrodes 14 there are bored hollows 35 larger in size a little than the electrode 14 with adjacent hollows 35 communicating with each other, and air exhausting grooves 36 are formed each extending from each row of hollows and opening at one margin of the spacer 32. The peel-off paper 34a adhered to the spacer 32 is removed and, as shown in FIG. 9, the spacer is adhered onto the lower electrode section 10 in such a way that the openings of air exhausting grooves 36 do not face the fold-up section 9. Accordingly, each electrode 14 of the lower electrode section 10 is exposed at the corresponding hollow of the spacer 32 with substantially the whole conductive layer 17 being covered by the electrically insulating spacer 32. Then, the upper electrode section 11 is turned down onto the spacer 32, whereby the lower electrode section 10 and the upper electrode section 11 are intercoupled by the film-like spacer 32 into one unit, thereby resulting in the thin membrane switch 3.

FIG. 10 illustrates the opposing state of the upper and lower electrodes 14 in which the upper and lower electrodes 14 are opposing each other with a certain spacing therebetween within the hollow 35 by interposition of the spacer 32. In this drawing, 37 is a hard support board made from metal, synthetic resin and the like. When the upper electrode 14 is pushed down from above, the upper base film 13 bends, the upper electrode 14 comes into contact with the lower electrode 14 to cause conduction, and a switch-on signal is obtained at that pushed point.

In the above, if the hollow 35 does not communicate with the air exhausting groove 36 and stands in a nearly airtight state, and when a pushing action is applied from above in order for signal entry, the air within the hollow 35 is compressed to raise its internal pressure and as a result, electrical contact between the upper and lower electrodes 14, i.e., input operation, becomes unreliable. To obviate the foregoing defect and to allow a reliable input operation, there is provided the air exhausting groove 36 communicating with the hollows 35 and this groove 36 extends up to the margin of the spacer 32.

Figure 11:
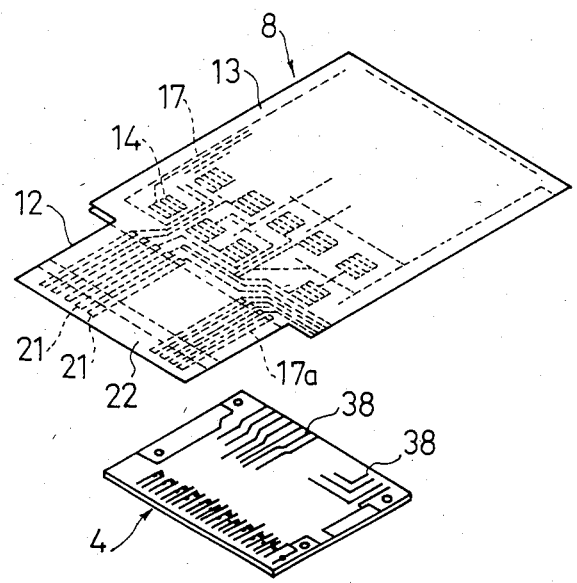
FIG. 11 is a schematic perspective view showing the state of the electrode assembly and a print-circuit board before they are joined together.
Figure 12A:
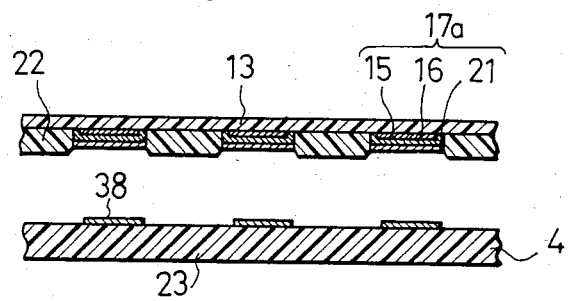
FIGS. 12a and 12b are enlarged sectional views showing the states, respectively, before and after the electrode assembly and the print-circuit board are joined together.
Figure 12B:
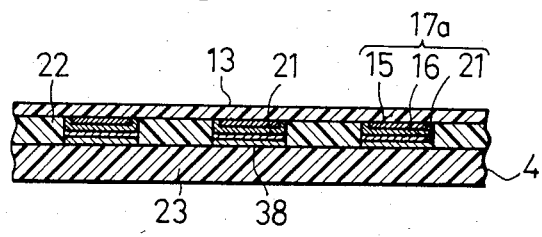

Then, the electrode assembly 8 completed by piling the lower electrode section 10 and the upper electrode section 11 upon each other into one unit, is bound to the print-circuit board 4. FIG. 11 and FIGS. 12a and 12b illustrate the states, respectively, before and after binding between the electrode assembly 8 and the print-circuit board 4.

The insulating substrate 23 employed as the print-circuit board 4 is made from glass, ceramic, glass-epoxy resin composite and the like, and contains silicon dioxide. On its surface there are formed thin-film-like conductive layers 38 of a certain pattern, made from copper and the like, with required electronic parts (not shown) also mounted thereon.

As shown in FIGS. 11 and 12a, the electrode assembly 8 is turned over, and the connecting lug section 12 of the electrode assembly 8 is placed on the print-circuit board 4 in such a manner that the conductive hot-melt type bonding agent layer 21 contacts with the end portion (the terminal section) of the conductive layer 38 of the print-circuit board 4. Then, by heating and pressing from the above of the connecting lug section 12 to cause fusion and allowing cooling of the hot-melt type bonding agent layers 21, 22, the electrode assembly 8 is integrally intercoupled with the print-circuit board 4. This state is shown in FIG. 12b where, as the result of fusion-adhesion of the conductive hot-melt type bonding agent layer 21, the conductive layer 38 of the print-circuit board 4 and the conductive layer 17 (the silver layer 15, the carbon layer 16, the conductive hot-melt type bonding agent layer 21) of the electrode assembly 8 are connected electrically together.

FIGS. 22a, 22b, 22c and 22d illustrate a modified example of the connecting lug section 12, i.e., the heat-seal connector.

Figure 22A:
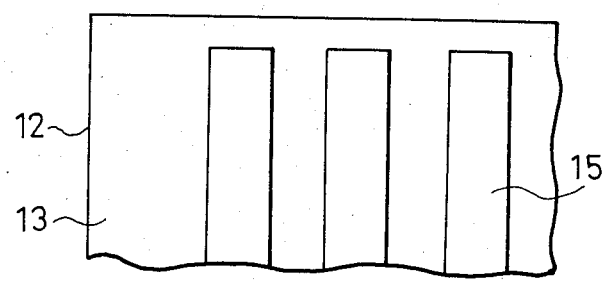
FIGS. 22a, 22b, 22c and 22d are enlarged partial plans showing the steps of forming another embodiment of the connecting lug section.
Figure 22B:
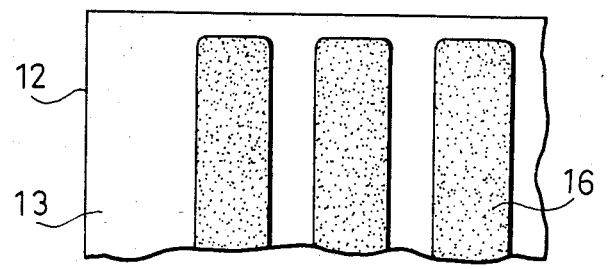
Figure 22C:
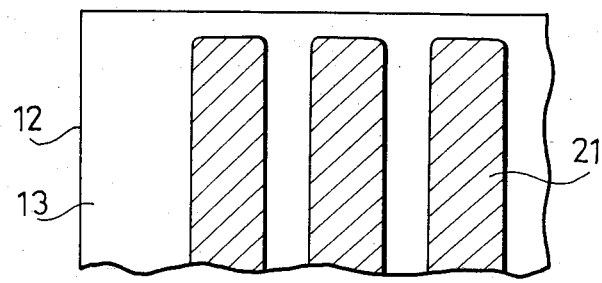
Figure 22D:
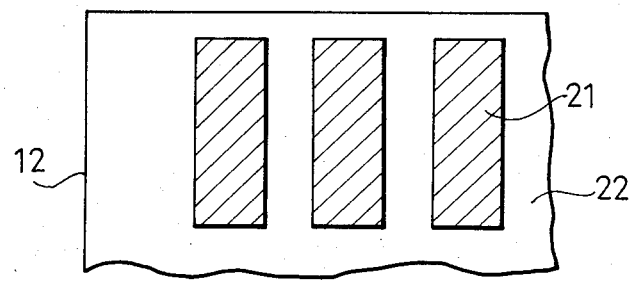

As shown in FIG. 22a, the stripe-shaped silver layer 15 is formed on the polyester-made base film 13 and thereon the carbon layer 16 is formed as to cover the silver layer 15 (see FIG. 22b). Then, as shown in FIG. 22c, on the carbon layer 16 the conductive hot-melt type bonding agent layer 21 is formed, thereafter, as to cover the surface portion of the base film 13 not formed with the bonding agent layer 21 and the surface portion of the bonding agent layer 21 not concerning the bonding, the electrically insulating hot-melt type bonding agent layer 22 is formed.

Similarly to the former embodiment, the surface of the bonding agent layer 22 is projecting beyond the surface of the bonding agent layer 21 and this bonding agent layer 22 covers the surface of the conductive hot-melt type bonding agent layer 21 thereby serving as the insulating protective film; thus, even if a conductive member such as a metal board comes into touch with the connecting lug section 12, this touch does not cause electrical short-circuiting among the conductive layers 17 (the silver layer 15, the carbon layer 16, the conductive hot-melt type bonding agent layer 21).

As described above in connection with the embodiments, in case the carbon layer 16 is provided as to cover the surface of the silver layer 15, xanthation of the silver layer 15 and migration of silver can be prevented. Further, in case a good conductive layer of high conductivity such as silver layer 15 or carbon layer 16 is provided inside the conductive hot-melt type bonding agent layer 21, an increase of the internal resistance owing to the bonding agent layer 21 is tempered and electrical connection is achieved satisfactorily.

Rather than mere press-bonding between the conductive layer 38 of the print-circuit board 4 and the conductive layer 17 of the electrode assembly 8, bonding achieved by means of the conductive hot-melt type bonding agent layer 21 results in a more reliable electrical connection. Here, because the conductive hot-melt type bonding agent layer 21 is mingled with conductive fine powders not concerning the bonding, a sufficient bonding strength can not be obtained only with the conductive hot-melt type bonding agent layer 21. Accordingly, in the embodiment, on both sides of the conductive hot-melt type bonding agent layer 21 there are provided the electrically insulating hot-melt type bonding agent layers 22 not including conductive fine powders, whereby a sufficient bonding strength is obtained and coming off of the conductive hot-melt type bonding agent layer 21 at the first place and others is prevented effectively.

Moreover, as shown in FIG. 5, in case the conductive layer 17 is not extended up to the margin of the connecting lug section 12 (the base film 13) and the hot-melt type bonding agent layer 22 is formed between the end of the conductive layer 17 and the margin of the base film 13, initial comming off of the conductive layer 17 at its end is surely prevented.

As described hereinabove, the present invention is characterized in that the connecting lug section is provided integrally at one end of the insulating substrate on the surface of which the thin-film-like electrodes are formed, the thin-film-like conductive layers continuing from the electrodes are extending up to the connecting lug section with their extended end portions composing the connecting terminal section so that this connecting terminal section will be connected to a terminal section of another circuit board.

According to the foregoing construction, the electrode section and connecting terminal section can be formed at the same time, and the insulating substrate and the connecting lug section form an integral structure; thus, the present invention can reduce the number of parts and provide the membrane switch of a high productivity.

While the preferred embodiments have been described, variations thereto will occur to those skilled in the art within the scope of the present invention concepts which are delineated by the following claims.

What is claimed is:

1. A membrane switch, adapted to be electrically and physically connected to a separate printed circuit board having conductive leads formed thereon, comprising:
   (a) an insulating substrate layer having first and second electrode sections, a fold-up section connecting said electrode sections, and a connecting lug section extending from one of said electrode sections, all of said sections being formed integrally with said insulating substrate layer, (b) said first and second electrode sections having upper and lower electrodes formed thereon, respectively, and said insulating substrate layer being folded along said fold-up section with an insulating spacer interposed between said electrode sections such that said upper and lower electrodes are opposed to each other separated by a space therebetween; and (c) thin-film conductive layers formed on said insulating substrate layer and extending from said upper and lower electrodes to terminal end portions formed on said connecting lug section, (d) said connecting lug section including said terminal end portions composed of said thin-film conductive layers having respective hot-melt type conductive bonding layers formed thereon, and a hot-melt type insulative bonding layer formed between and around said terminal end portions on said insulating substrate layer, whereby said membrane switch can be electrically and physically connected to said printed circuit board by hot-melt bonding of said conductive bonding layers between said thin-film conductive layers of said membrane switch and said conductive leads of said printed circuit board, and of said insulative bonding layer between said insulating substrate layer and said printed circuit board.

2. A membrane switch according to claim 1, wherein said fold-up section is an elongate boundary portion between said first and second electrode sections and includes a linear slit provided over a middle part of said fold-up section, said linear slit terminating in a pair of tear-preventing holes provided at both ends thereof, and said thin-film conductive layers extending from one of said electrode section across said fold-up section being disposed to one side beyond said linear slit.

3. A membrane switch according to claim 1, wherein said upper and lower electrodes and said thin-film conductive layers comprise a metallic layer and a carbon layer extending over and on the sides of said metallic layer.

4. A membrane switch according to claim 1, wherein said terminal end portions are spaced from an edge of said connecting lug section by a clearance, and said hot-melt type insulating bonding layer extends into said clearance.

5. A membrane switch according to claim 1, wherein said hot-melt type bonding layers include a compound providing a hydrophobe characteristic.

* * * * *